United States Patent
Chung

[19]

[11] Patent Number: 6,165,893
[45] Date of Patent: Dec. 26, 2000

[54] INSULATING LAYERS AND A FORMING METHOD THEREOF

[75] Inventor: Seog-Chul Chung, Chungcheongbuk-do, Rep. of Korea

[73] Assignee: Hyundai Electronics Industries Co., Ltd., Ichon-shi, Rep. of Korea

[21] Appl. No.: 09/317,954

[22] Filed: May 25, 1999

[30]    Foreign Application Priority Data

Jan. 29, 1999 [KR]   Rep. of Korea ......................... 99-2877

[51] Int. Cl.$^7$ .......................... H01L 29/06; H01L 23/58; H01L 29/40
[52] U.S. Cl. .......................... 438/623; 438/622; 438/633; 438/637; 438/778; 438/780
[58] Field of Search .................................. 438/622, 623, 438/633, 637–640, 778, 780, 782, 787, 404, 424, 427

[56]              References Cited

U.S. PATENT DOCUMENTS

| | | | |
|---|---|---|---|
| 5,858,870 | 1/1999 | Zheng et al. ............................ | 438/622 |
| 6,025,230 | 2/2000 | Hshieh et al. .......................... | 438/268 |
| 6,037,253 | 3/2000 | Chung ..................................... | 438/639 |

OTHER PUBLICATIONS

N. Oda et al.; 0.6 μm Pitch Highly Reliable Multilevel Interconnection Using Hydrogen Silicate Based Inorganic SOG for Sub–Quarter Micron CMOS Technology; 1997 Symposim on VLSI Technology Digest of Technical Papers; pp. 79–80.

Juseon Goo et al.; Reliable and Simple Non–Etch Back Process for Intermetal Dielectric (IMD) of 256M DRAM Using Spin–on Hydrogen Silsesquioxane (HSQ); Feb. 10–11, 1997 DUMIC Conference; pp. 329–332.

J. Waeterloos et al; "Integrating a hydrogen silsesquioxane spin–on dielectric in a quarter micron technology;" Feb. 10–11, 1997 DUMIC Conference; pp. 310–316.

*Primary Examiner*—Richard Booth
*Assistant Examiner*—Ha Tran Nguyen
*Attorney, Agent, or Firm*—Fleshner & Kim, LLP

[57]              ABSTRACT

The present invention relates to insulating layers and a forming method thereof, more particularly, to planarized insulating layers among wires on the same insulating layer or different layers and a forming method thereof which minimize parasitic capacitance generated from the wires, prevent via poison and reduce step difference between the adjacent layers by forming a dielectric layer having a low dielectric constant between the wires patterned in the same layer and by forming an insulating interlayer having excellent heat-dissipation efficiency and interface-adhesiveness between the wires in the different layer. The present invention includes an insulated substrate, an insulating interlayer on the insulated substrate, a plurality of first wires on the insulating interlayer, a first insulating layer formed only on upper surfaces of a plurality of the first wires, a second insulating layer filling up valleys between the first wires and the first insulating layer wherein surfaces of the first and second insulating layers lie on a same plane, a third insulating layer on the surfaces of the first and second insulating layer, a plurality of second wires on the third insulating layer, and a plurality of plugs connecting the first wires electrically to the second wires, the plugs formed through the first and third insulating layer.

13 Claims, 7 Drawing Sheets

INSULATING LAYERS AND A FORMING METHOD THEREOF

BACKGROUND OF THE INVENTION

1. Field of the Invention

The present invention relates to insulating layers and a forming method thereof, more particularly, to planarized insulating layers among wires on the same insulating layer or different layers and a forming method thereof which minimize parasitic capacitance generated from the wires, prevent via poison and reduce step difference between the adjacent layers by forming a dielectric layer having a low dielectric constant between the wires patterned in the same layer and by forming an insulating interlayer having excellent heat-dissipation efficiency and interface-adhesiveness between the wires in the different layer.

2. Discussion of Related Art

It is essential to form insulating layers of low dielectric constants which are used as insulating substances among wires or insulating interlayers for VLSI devices of high performance such as a high-end processor and a system on a chip. This is because the insulating layers of low k's which are dielectric constants reduce wiring delay among wires and power consumption.

Related arts which use spin-on substance for insulation and low dielectric characteristic as inter-metal dielectric are largely divided into an etchback method using organic Spin-On Glass (hereinafter abbreviated SOG) and a non-etchback method using inorganic SOG and spin-on polymers.

When an organic insulating layer is used, 'via poison' is generated from moisture uptake which is caused by the loss of carbonic functional groups included in the insulating layer due to chemical reactions on an $O_2$ ashing step for removing the photoresist accompanied by a via hole etch. This is because carbonic functional groups are vulnerable to $O_2$ ambience. Therefore, a surface of an insulating layer is planarized by a conventional etchback method to remove the organic layer in areas where via holes are to be formed.

When an inorganic insulating layer is used, a surface of the insulating layer having no carbonic functional group inside is planarized by a non-etchback method. This is because an insulating layer is formed directly on wires by a spin-on method, and then, via holes are formed.

In order to increase the reliance of the via holes where plugs for electrical interconnection through respective conductive layers are formed, when there are sufficient margins of the pitches among the wires formed by patterning the same conductive layer, an etchback method which uses a sacrificial layer of an oxide liner which is formed thick by Plasma-Enhanced Chemical Vapor Deposition (hereinafter abbreviated PECVD) prevails.

On the other hand, when there is insufficient margin for the pitches among the wires formed by patterning the same conductive layer, it is unable to form the oxide liner thick. Therefore, a non-etchback method is used. The non-etch back method improves the characteristics of a low-dielectric layer only if the oxide liner is formed thick.

Therefore, a direct-on metal (hereinafter abbreviated DOM) method which skips the step of forming an oxide liner is used instead.

The DOM method reduces capacitance of an wire-insulation layer by coating directly the patterned wires with spin-on substance but causes via poison in via hole areas and corrosion of the wires.

Thus, reliance of the device decreases.

The method of thickening the side walls of the via holes by plasma treatment after the formation of the via holes or portions of a low dielectric layer near the via holes by electron beams is essential to improve the 'via poison' in the non-etchback method using the low dielectric layer. As the pitches on the same layer become narrow one another, parasitic capacitance increases. Thus, the low dielectric layer reduces the parasitic capacitance to prevent wiring delay by reducing the parasitic capacitance. The most of the low dielectric layer is deposited on the wires by the spin-on method, and then, shows the etchbacked structure or the non-etchbacked according to the following step.

FIG. 1A to FIG. 1D show cross-sectional views of forming insulating layers by an etchback method according to a related art, wherein a low dielectric layer of organic substance is used for insulation among wires.

Referring to FIG. 1A, a first insulating interlayer 11 is formed on a silicon substrate 10 of semiconductor on which devices such as transistors are formed or to be formed.

After a first wiring layer has been formed by depositing electrically-conductive substance such as Al or the like on the silicon substrate 10, a first wire 121 is formed by etching the first wiring layer by photolithography.

An oxide liner 130 as a sacrificial layer of an etch-stop layer on forming via holes are deposited on exposed surfaces of the first wire 121 and the firs insulating interlayer 11 by PECVD.

A planarized surface of the substrate is achieved by forming a low dielectric layer 140 of organic substance having a low k on the oxide liner 130 to bury the valleys among the first wire 121 by the spin-on method.

Referring to FIGS. 1B, a portion of the low dielectric layer 141 is left in the valleys among the first wires 121 by etching back the low dielectric layer in use of the oxide liner 130 as an etch-stop layer. In this case, the remaining low dielectric layer 141 of organic substance decreases parasitic capacitance. Yet, it is disadvantageous to reducing parasitic capacitance as the total remaining thickness of the low dielectric layer is reduced by the thickness of the oxide liner 130. The reason why the low dielectric layer of organic substance over the first wires 121 is to secure the reliance of via holes in an insulating interlayer which is going to be formed.

Referring to FIGS. 1C, a second insulating interlayer 150 is formed by depositing a silicon oxide layer on surfaces of the remaining low dielectric layer 141 and the remaining oxide liner 130 by PECVD. In this case, the second insulating interlayer 150 is free from the carbonic functional groups because it is not formed with organic substance, whereby via poison in via holes and the deformation of via hole profiles are prevented.

Referring to FIG. 1D, via holes in which plugs for interconnecting wire layers each other are formed by etching predetermined portions of the second insulating interlayer 151 and the oxide liner 131 by photolithography. These via holes are free from the 'via poison'.

A conductive layer of Al, W or the like is deposited on the remaining second insulating interlayer 151 to fill up the via holes. Then, plugs 16 are formed by leaving the conductive layer only inside the via holes by Chemical-Mechanical Planarization (hereinafter abbreviated CMP).

A conductive wire layer is deposited on a surface of the second insulating layer 151 including the exposed plugs 16. A second wire 17 is formed by patterning the conductive wire layer.

As mentioned in the above description, the etchback structure is characterized by the need of the oxide liner 131. The oxide liner 131 is used as a sacrificial layer on etching the low dielectric layer 141, and prevents the low dielectric layer 141 vulnerable to oxygen plasma or wet etchant from remaining on the first wire 121 over which the via holes are to be formed.

Preventing the 'via poison', the etchback structure fails to contribute to the decrease of parasitic capacitance. This is because the thickness of the oxide liner occupies the space for the low dielectric layer between the first wires 121.

FIG. 2A to FIG. 2C show cross-sectional views of forming insulating layers by a non-etchback method according to a related art, wherein a low dielectric layer of inorganic substance is used for insulation among wires.

Referring to FIG. 2A, a first insulating interlayer 21 is formed on a silicon substrate 20 of semiconductor on which devices such as transistors are formed or to be formed.

After a first wiring layer has been formed by depositing electrically-conductive substance such as Al or the like on the silicon substrate 20, a first wire 22 is formed by etching the first wiring layer by photolithography.

A low dielectric layer 230 is formed by coating exposed surfaces of the first wire 22 and the first insulating interlayer 21 with inorganic substance of low k by the spin-on method which provides a planarized surface of the low dielectric layer 230.

Referring to FIGS. 2B, a second insulating interlayer 240 is deposited on the low dielectric layer 230 by PECVD. However, the method of thickening the low dielectric layer 230 near the side walls of the via holes by plasma treatment after the formation of the via holes or portions of the low dielectric layer 230 near the via holes by electron beams is essential to improve the 'via poison' in the non-etchback method using the low dielectric layer.

Referring to FIG. 2C, via holes where plugs to connect wire layers each other electrically are to be formed are formed by removing predetermined portions of the second insulating interlayer 240 and the low dielectric layer 230 by dry etch of photolithography until surfaces of the first wires 22 are exposed. The step of thickening around the via holes is required for preventing 'via poison'. A conductive layer of W, Al or the like is deposited on the second insulating interlayer 241 to fill up the via holes. Then, plugs 25 are formed by carrying out CMP on the conductive layer to remain only in the via holes.

And, another wire layer of metal is deposited on the second insulating interlayer including the surfaces of the exposed plugs 25. Then, second wire 26 of metal are defined by patterning the wire layer.

The above non-etchback structure adopts the oxide liner if necessary. But, the non-etchback structure decreases parasitic capacitance greatly because the low dielectric layer 231 which does not cause corrosion of the first wires 22 may be formed directly on the first wires 22 by the spin-on method. In this case, compared to the case of forming the oxide liner, the parasitic capacitance is reduced to maximum 23%.

Unfortunately, when the first wires 22 are fully surrounded by the low dielectric layer 231 (Direct-On Metal), heat conductivity of the low dielectric layer is inferior to that of the PECVD oxide layer. And the reliance of the wires is reduced because heat generated from the first wires 22 on operation has to pass through the low dielectric layer to be dissipated outside. Moreover, the performance of adhesion between the low dielectric layer 231 and the second insulating interlayer 241 may be deteriorated by the stress which is generated from the wire bonding since the low dielectric layer 231 is directly contacted with the first wires 22.

As mentioned in the above description, the related art of insulating layers among wires and a forming method thereof has the following problems.

Firstly in the etchback structure, the decrease of parasitic capacitance is lessened by the thickness of the oxide liner. And, there is a limit to the thickness of the oxide liner which works as a sacrificial layer during a step of etchback as the margin of critical dimension between the wires decreases. Moreover, when the step difference between a cell part and a peripheral part is large and the thickness of the oxide liner is thin, the process margin also decreases due to the etch of the wires.

Secondly in the non-etchback structure, when the oxide liner is used, the reducing effect of parasitic capacitance is decreased as is in the etchback structure. And, the reliance of the wires are also decreased due to the plasma or electron beam treatment on the low dielectric layer for the prevention of 'via poison'. If the oxide liner is not used, the effect of heat dissipation is deteriorated as heat generated from the first wires passes through the low dielectric layer having relatively-low heat conductivity. Moreover, the performance of adhesion between the low dielectric layer and the second insulating interlayer may be caused on wire bonding.

SUMMARY OF THE INVENTION

Accordingly, the present invention is directed to insulating layers and a forming method thereof that substantially obviate one or more of the problems due to limitations and disadvantages of the related art.

The object of the present invention is to provide insulating layers and a forming method thereof which minimize parasitic capacitance generated from the wires, prevent via poison and reduce step difference between the adjacent layers by forming a dielectric layer having a low dielectric constant between the wires patterned in the same layer and by forming an insulating interlayer having excellent heat-dissipation efficiency and interface-adhesiveness between the wires in the different layer.

Namely, the present invention improves the reducing effect of parasitic capacitance in the etchback structure using the low dielectric layer and also ameliorates the 'via poison', low heat conductivity and the failure of adhesion in the related art.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes an insulated substrate, an insulating interlayer on the insulated substrate, a plurality of first wires on the insulating interlayer, a first insulating layer formed only on upper surfaces of a plurality of the first wires, a second insulating layer filling up valleys between the first wires and the first insulating layer wherein surfaces of the first and second insulating layers lie on a same plane, a third insulating layer on the surfaces of the first and second insulating layer, a plurality of second wires on the third insulating layer, and a plurality of plugs connecting the first wires electrically to the second wires, the plugs formed through the first and third insulating layer.

In another aspect, the present invention includes the steps of forming an insulating interlayer on an insulated substrate, forming a first conductive layer and a first insulating layer on the insulating interlayer successively, forming a first wire by removing predetermined portions of the first insulating layer and the first conductive layer wherein the first insulating layer remains only on the first wire, filling up spaces where the removed first insulating and conductive layers have been located with a second insulating layer, forming a third insulating layer on the second insulating layer and the remaining first insulating layer, forming a via hole exposing a predetermined portion of the first wire by removing predetermined portions of the first and third insulating layers which are overlapped each other, forming a conductive plug filling up the via hole, and forming a second wire on the third insulating layer wherein the second wire is connected to the plug electrically.

In a further aspect, the present invention includes the steps of forming an insulating interlayer on an insulated substrate, forming a first conductive layer and a first insulating layer on the insulating interlayer successively, forming a first wire by removing predetermined portions of the first insulating layer and the first conductive layer wherein the first insulating layer remains only on the first wire, filling up spaces where the removed first insulating and conductive layers have been located with a second insulating layer, and forming a third insulating layer on the second insulating layer and the remaining first insulating layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

DETAILED DESCRIPTION OF PREFERRED EMBODIMENTS

Figure 1A:
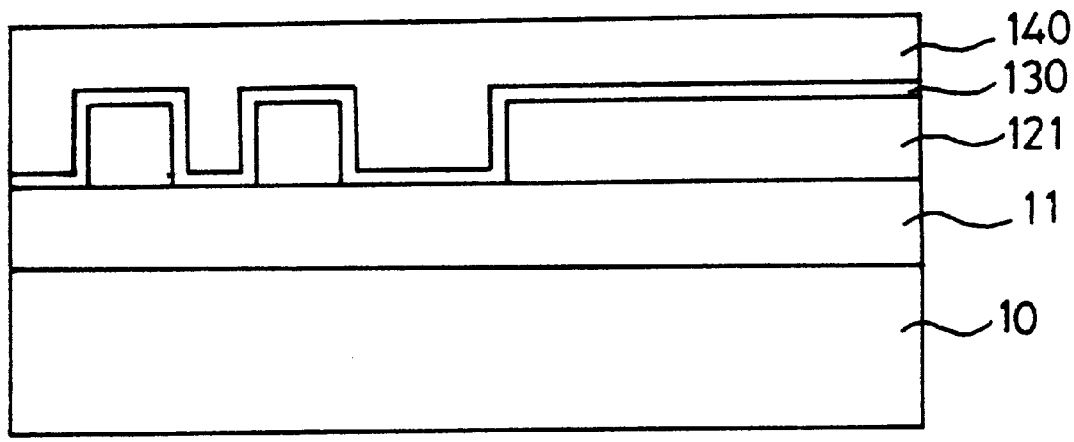
FIG. 1A to FIG. 1D show cross-sectional views of forming insulating layers in a semiconductor device by an etchback method according to a related art.
Figure 1B:
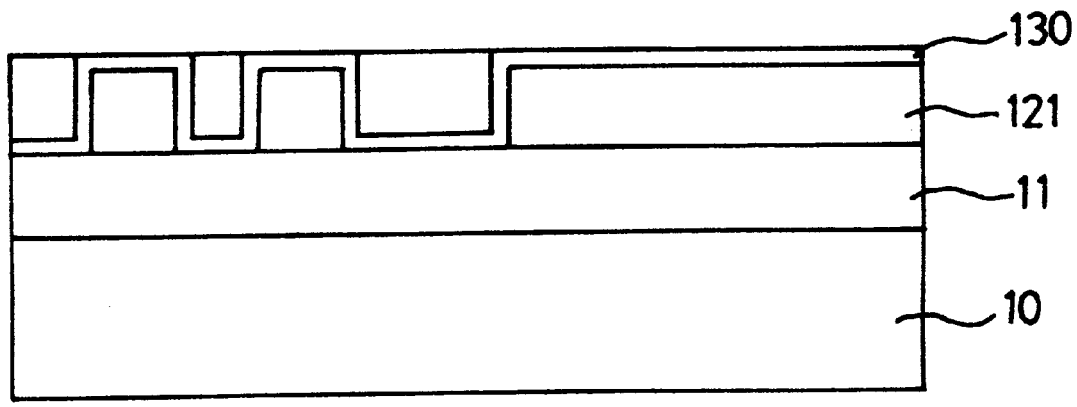
Figure 1C:
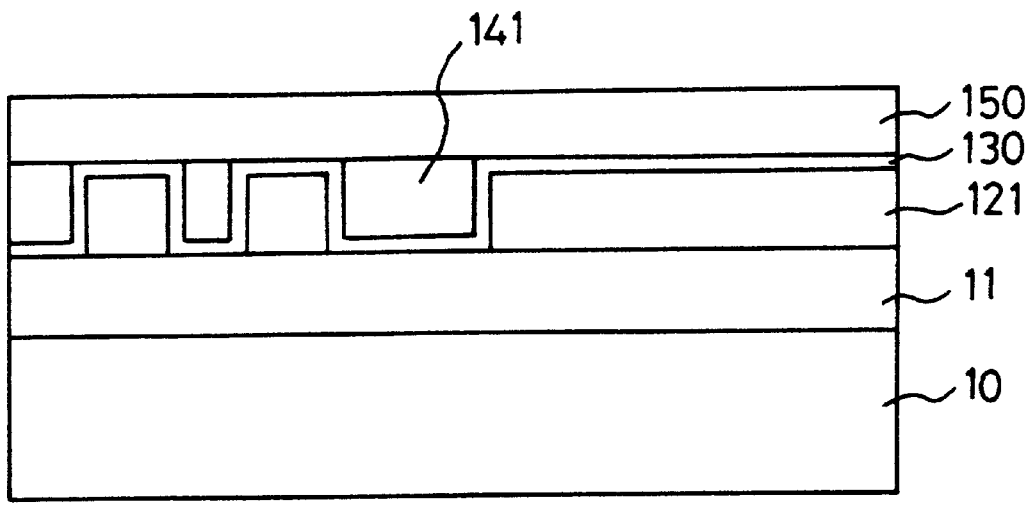
Figure 1D:
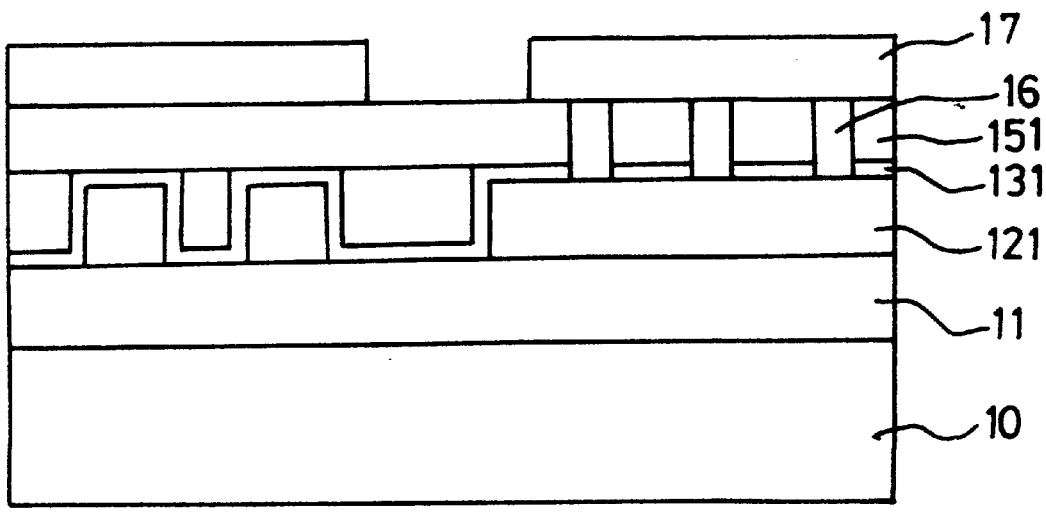
Figure 2A:
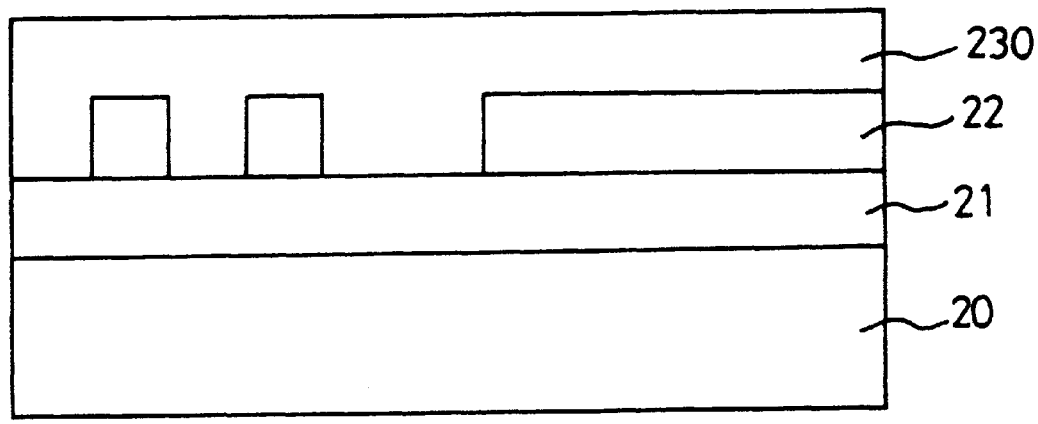
FIG. 2A to FIG. 2C show cross-sectional views of forming insulating layers in a semiconductor device by a non-etchback method according to a related art.
Figure 2B:
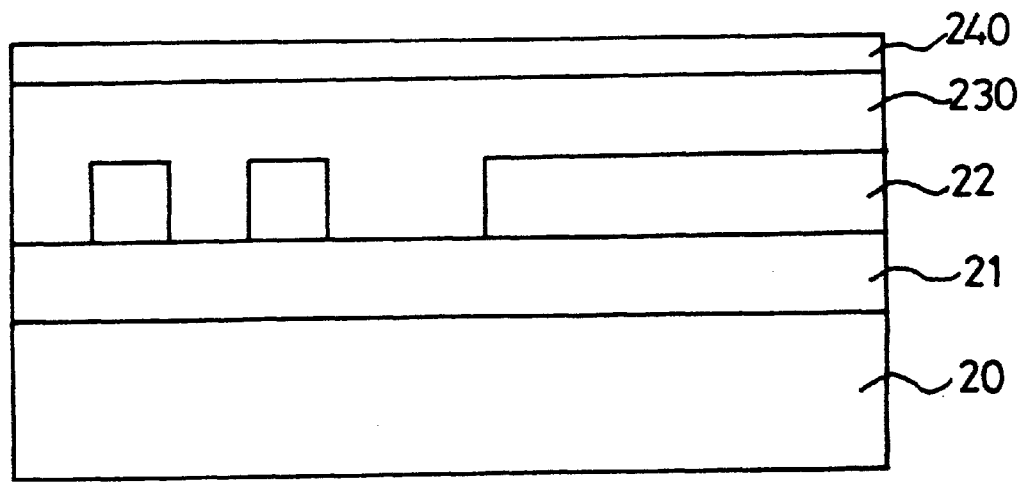
Figure 2C:
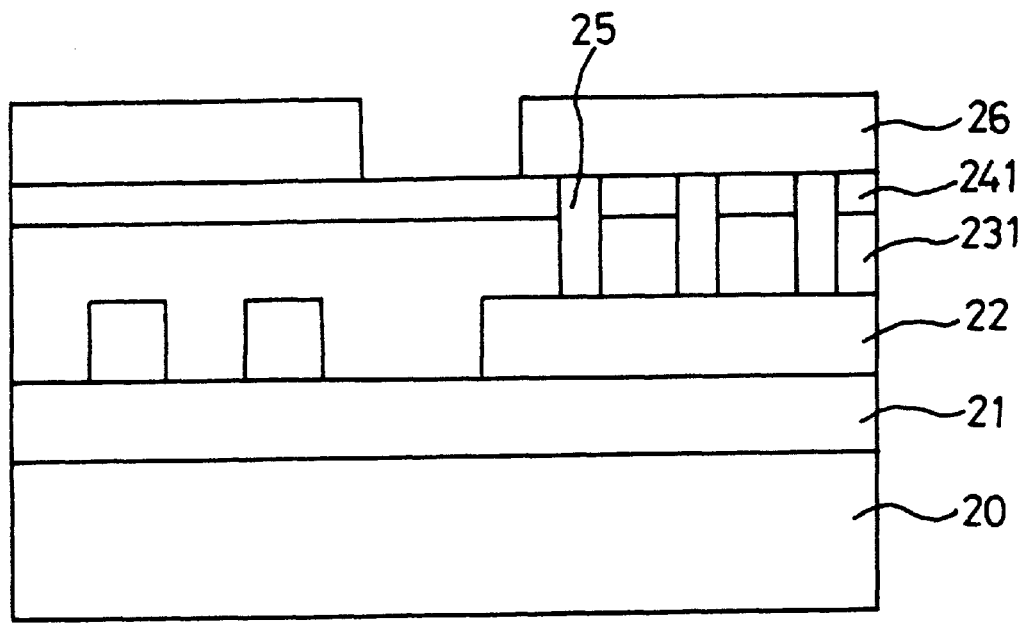

Reference will now be made in detail to the preferred embodiment of the present invention, an example of which is illustrated in the accompanying drawings.

As the integration of a semiconductor chip increases ultra-highly, a dielectric rate of a dielectric substance between metal wires is the main concern in the technology under 0.25 $\mu$m. For this purpose, the techniques of various CVD or spin-on are commercially used in the art. In these techniques, metal layers of at least 6 are formed for the wires among the layers. In this case, parasitic capacitance brought about by the wires delays the operation speed of a device.

In order to reduce the parasitic capacitance greatly, the present invention embodies an inter-metal dielectric (hereinafter abbreviated IMD) layer to minimize the capacitance among the wires by forming spin-on polymer having low dielectric constant usually under 4 between the valleys structured by the wires on the same layer.

Accordingly, 'via poison' of the related art is eliminated in the present invention, and the decreasing reliance of the wires which is caused by the low heat conductivity common in the low dielectric layers of polymers is also improved. Moreover, the present invention embodies an IMD structure which provides an excellent adhesiveness proper to the mechanical strength in the wire bonding by forming lower and upper wires only with PECVD layers.

The characterized constitutions of the present invention is explained in the following description.

First, a low dielectric layer which means that the dielectric substance has a dielectric constant(k) less than 4.0 is formed between wires to reduce parasitic capacitance therein.

A PECVD oxide layer having sufficient thickness is formed on a wire layer to be patterned. After the PECVD oxide layer and the wire layer have been etched in use of an etch mask to form wires, a low dielectric layer of polymers is formed between the wires by a spin-on method. Thus, a structure which minimizes parasitic capacitance, as the valleys between the wires defined by patterning the same layer are filled up with the low dielectric layer, is provided.

Second, the polymers which have been formed by spin-on and remain on the very PECVD oxide layer on the wires are removed properly by etchback. In this case, a PECVD oxide layer is formed only on the wires. Thus, a space margin providing sufficient spaces between the wires where the low dielectric layer is formed is secured, and the PECVD oxide layer on the wires works as a protection layer against etch on etching the low dielectric layer.

Then, a secondary PECVD oxide layer is deposited on the low dielectric layer and the exposed PECVD oxide layer.

All the via hole regions where plugs connecting wires on different layers electrically one another are to be formed are comprised of PECVD oxide which prevents damages generated from oxygen plasma and an wet etchant on an etching step for the via holes. Thus, the reliance of the via holes is improved by preventing the 'via poison' generated when the plugs of metal are formed after the completion of the via holes. In this case, the PECVD oxide layer may be replaced by an insulating layer formed by $O_3$-TEOS reaction or another insulating layer which includes carbons and has high heat conductivity.

This structure minimizes the wiring delay by reducing parasitic capacitance between the wires and eliminates the 'via poison' to improve the reliance of a device. And, heat generated from the increasing current density is dissipated effectively through the PECVD oxide layer since upper and lower wires are contacted with the PECVD oxide layer of excellent heat conductivity. Thus, the reliance of the wires are increased. In this case, heat conductivity of the polymers of the low dielectric layer is one third that of the PECVD oxide in general.

In addition, the non-etchback structure of the related art may bring about failure of wire bonding in a packaging process provided that spin-on polymers remain on the metal wires. This is because the capability of adhesion between the oxide liner and the low dielectric layer is reduced by the difference between the bonding characteristic of the PECVD oxide layer of silicate and that of the spin-on polymers consisting of carbons and hydrogens.

The present invention is characterized by the following points from the related art.

First, after a PECVD oxide layer has been formed on an wiring layer, wires are formed by patterning the PECVD oxide layer and the wiring layer in use of the same etch mask.

Second, formed is the structure where the PECVD oxide layer protects the wires and the valleys between the wires are filled up with low dielectric substance. This structure is attained by neither the etchbak nor non-etchback structure.

Third, additional steps such as plasma densification and electron-beam curing are not necessary for the present invention as the effect of the DOM (direct on metal) method is provided and the spin-on low dielectric substance does not exist around the via hole regions.

Accordingly, the present invention minimizes the wiring delay among the wires by improving the defects of the etchback and non-etchback structures and provides an insulating layer between inter-metal wires to secure the reliance of the via holes.

Figure 3A:
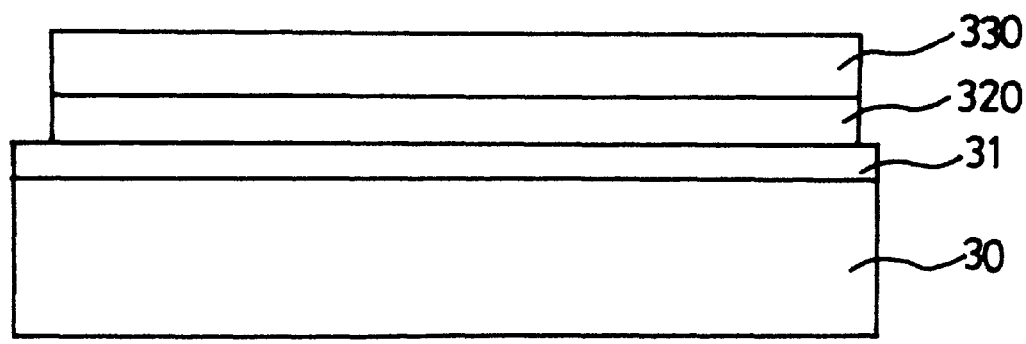
FIG. 3A to FIG. 3F show cross-sectional views of forming insulating layers in a semiconductor device by a non-etchback method according to the present invention.
Figure 3B:
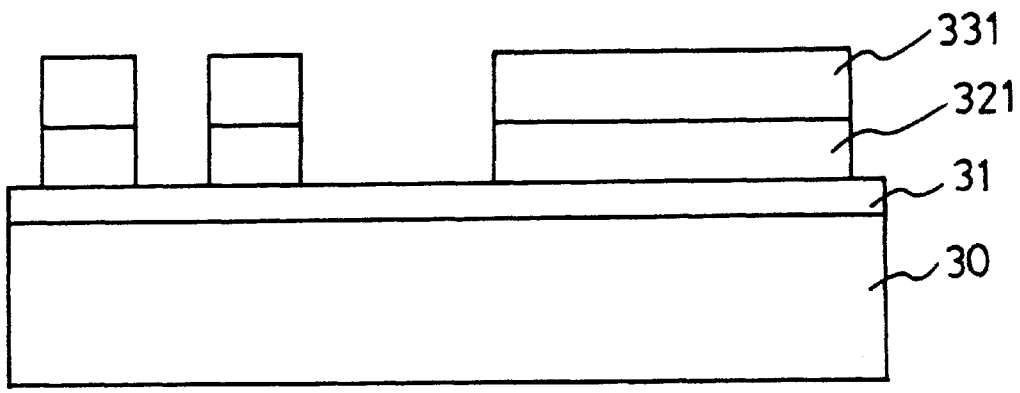
Figure 3C:
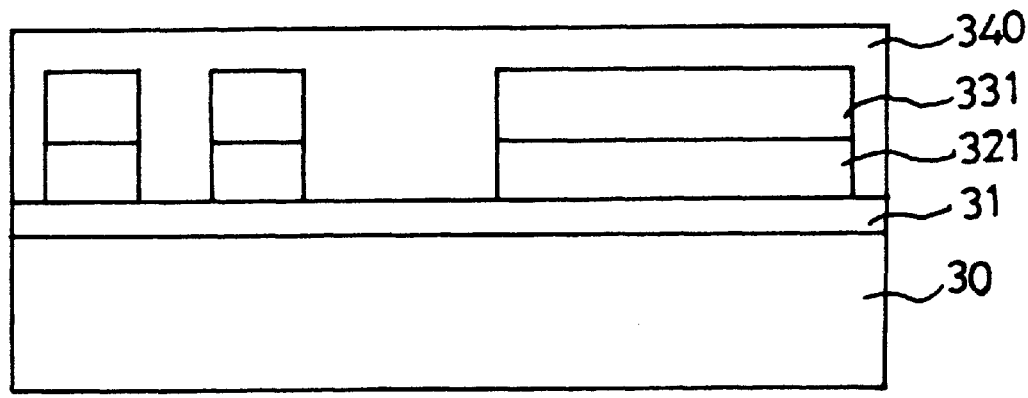
Figure 3D:
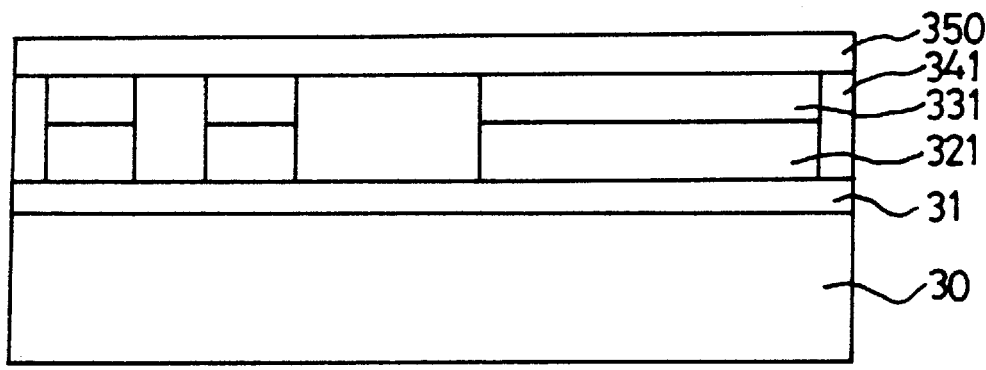
Figure 3E:
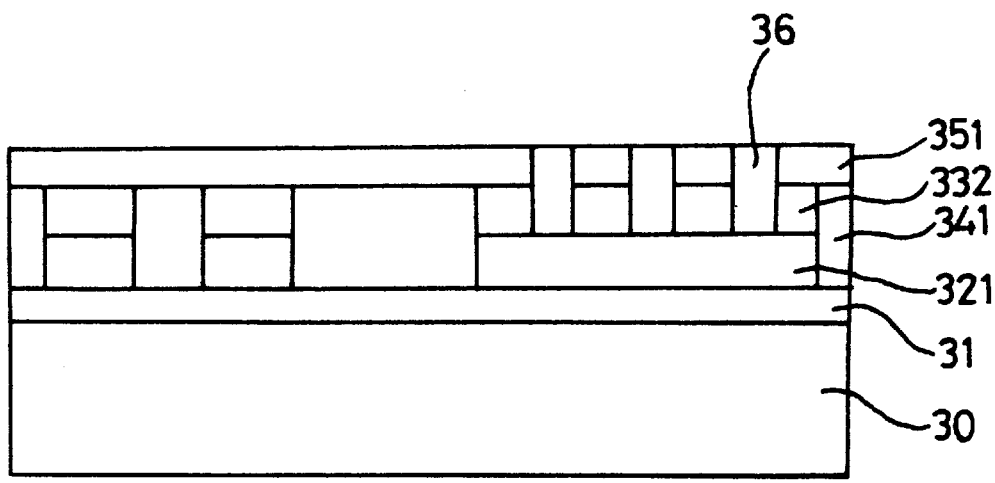
Figure 3F:
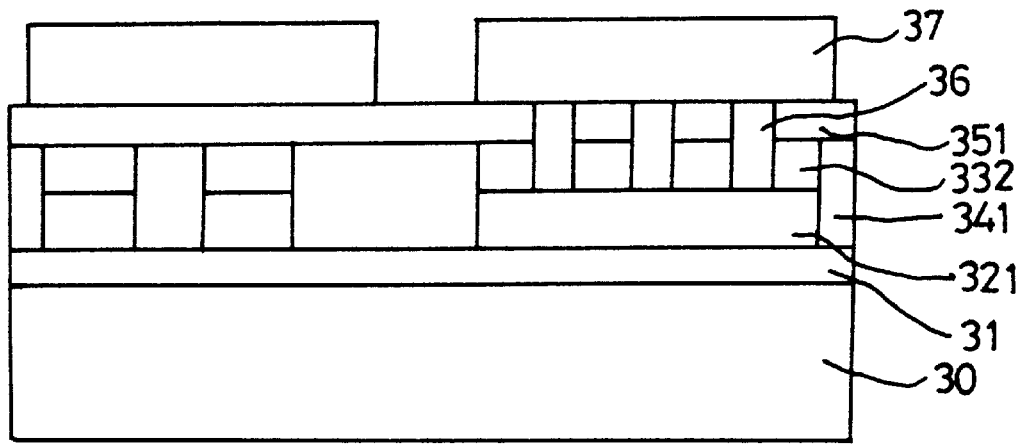
Figure 4:
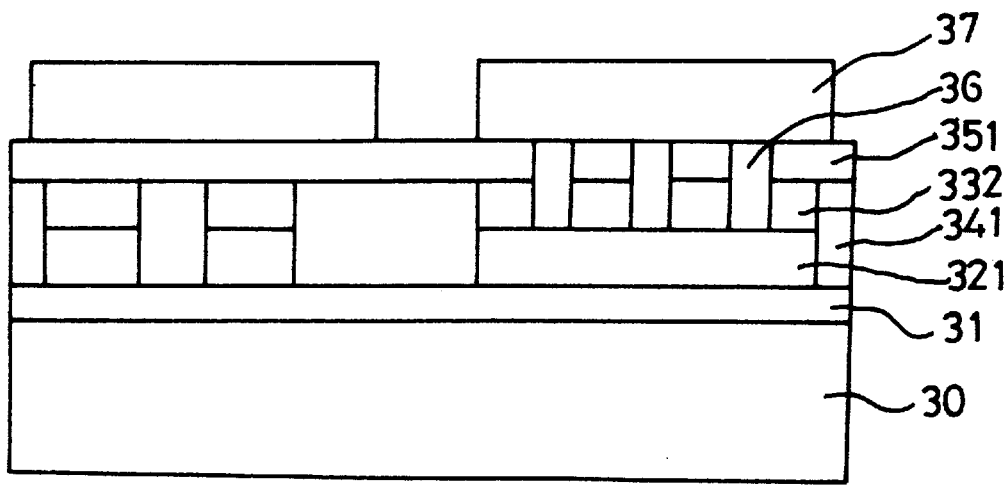
FIG. 4 shows a cross-sectional view of insulating layers in a semiconductor device.

FIG. 3A to FIG. 3F show cross-sectional views of forming insulating layers in a semiconductor device by a non-etchback method according to the present invention, and FIG. 4 shows a cross-sectional view of insulating layers in a semiconductor device.

Referring to FIG. 3A, a first insulating interlayer 31 of dielectric substance is formed on a silicon substrate 30 of semiconductor where devices such as transistors and the like have been formed. Then, a first wire layer 320 is formed on the first insulating interlayer 31 by depositing conductive substance such as Al or the like for wires by CVD.

A first PECVD oxide layer 330 for protecting wires against overetch and forming via holes is deposited on the first wire layer 320 by PECVD. In the later step, the first PECVD oxide layer 330 becomes to remain only on the first wire to work as an etch protection layer so as to enhance the margin of the thickness of deposition.

Referring to FIG. 3B, in order to form first wires 320 comprised of the remaining first wire layer 320, an etch mask, which is not shown in the drawing, is formed by coating the first wire layer 320 with photoresist and by carrying out exposure and development in use of a mask for first wires. A portion of the first PECVD oxide layer 331 under the etch mask is left on the first wire layer 321 by removing the the other portion of the first PECVD oxide layer 330 which is not protected by the etch mask by an anisotropic etch such as a dry etch or the like. Successively, first wires 321 comprised of the remaining first wire layer 321 are formed by removing a portion of the first wire layer 320 which is not protected by the same etch mask by anisotropic etch.

Accordingly, the first PECVD oxide layer 331 on the first wires 321 protects the first wires 321 from the damages on a later step of etching a low dielectric layer. And, there is no first PECVD oxide layer at the sides of the first wires 321 so that spaces for the low dielectric layer are sufficiently provided.

Then, the etch mask is removed.

Referring to FIG. 3C, a low dielectric layer 340 of polymers is formed over the substrate 30 to cover the exposed surfaces of the first insulating interlayer 31 and the first PECVD oxide layer 331 and the sides of the first wires 321 by the spin-on method. In this case, a surface of the low dielectric layer 340 is planarized automatically because of the spin-on method and the parasitic capacitance is minimized as the low dielectric layer 340 is formed in the spaces between the first wires to the maximum.

Referring to FIG. 3D, in order to remove the low dielectric layer 340 on the remaining first PECVD oxide layer 341, the low dielectric layer 340 is etched back to expose a surface of the first PECVD oxide layer 331.

Accordingly, the low dielectric layer 341 remains only in the valleys between the first wires 321 and the first PECVD oxide layer 331 lies on the first wires 321. Thus, the 'via poison' is prevented in the later steps.

A second PECVD oxide layer 350 is deposited on the surfaces of the remaining low dielectric and first PECVD oxide layers 341 and 331. Heat conductivity of the second PECVD oxide layer 350 is superior to that of the low dielectric layer 341. Thus, the second PECVD oxide layer 350 dissipates heat generated from the wires effectively during the operation of devices. And, 'via poison' and the deformation of the via holes are prevented since via holes are formed in the second PECVD oxide layer 350 on the first PECVD oxide layer 331 and portions of the first PECVD oxide layer 331.

Referring to FIG. 3E, after the second PECVD oxide layer has been coated with photoresist, a photoresist pattern of an etch mask for forming via holes, which exposes surfaces of the second PECVD oxide layer through which via holes are to be formed, is defined by exposure and development in use of a mask defining via holes.

Via holes exposing exposing partial surfaces of the first wires 321 are formed by etching the second and first PECVD oxide layers which are not covered with the photoresist pattern by anisotropic etch such as dry etch. As the via holes are formed within the areas of the PECVD oxide layers, the reliance of the via holes are improved.

Then, the photoresist pattern is removed. During the O2 ashing step of removing the photoresist pattern, 'via poison' due to the moisture uptake which is caused by the loss of carbonic functional groups of polymers is prevented by forming the via holes in the PECVD oxide layers.

A conductive layer of Al, W or the like to fill up the via holes is deposited on the second PECVD oxide layer 351. Then, plugs 36 remaining only inside the via holes are formed by carrying out CMP(Chemical-Mechanical Planarization).

Referring to FIG. 3F, a conductive wire layer of Al or the like is deposited on the second PECVD oxide layer 351 including surfaces of the exposed plugs 36. Second wires 37 are formed by patterning the conductive wire layer.

FIG. 4 shows a cross-sectional view of insulating layers among wires in a semiconductor device. Referring to FIG. 4, a first insulating interlayer 31 is formed on a silicon substrate 30 of semiconductor.

First wires 321, which are separated one another by predetermined intervals to construct valleys and are comprised of electrically-conductive substance such as Al or the like to connect devices such as transistors electrically one another, are patterned on predetermined portions of the first insulating interlayer 31.

A first PECVD oxide layer 332 is formed on the upper surfaces of the first wires 321. A low dielectric layer 341 of polymers of which dielectric constant is low is formed in wire patterns 321 and 332 comprised of the first wires 321 and the first PECVD oxide layer 332. Surfaces of the first PECVD oxide layer 332 and the low dielectric layer 341 are located at the same plane to provide a planarized surface of the structure.

A second PECVD oxide layer 351 having predetermined thickness is formed on surfaces of the first PECVD oxide and low dielectric layers 332 and 341.

Via holes, in which plugs connecting upper wires electrically to the first wires 321 of lower wires are formed, are formed at the locations where the first PECVD oxide layer 332 is overlapped with the second PECVD oxide layer 351.

Plugs filling up the via holes are formed with electrically-conductive substance such as W or the like. Second wires 37 of upper wires contacted with upper surfaces of the plugs are formed with electrically-conductive substance such as Al or the like.

Accordingly, the present invention minimizes parasitic capacitance by forming an insulating layer with a low dielectric substance at the spaces between the wires on the same plane.

The present invention is also superior to the related art using an oxide liner because a PECVD oxide layer is only formed on the upper surface of the wires to provide a process margin of deposition thickness of the PECVD oxide layer. Thus, it is desirable to overcome the step difference when an etchback step is carried out.

The present invention prevents the 'via poison' as the parts where via holes are formed are comprised of PECVD oxide despite forming the insulating layer between the wires with a low dielectric substance.

And, the present invention improves the reliance of the wires and devices since heat generated from the wires is dissipated through the PECVD oxide layer having excellent heat conductivity. Moreover, the mechanical strength of the present invention is superior to that of the non-etchback structure of the related art at the step of wire bonding as the double-layered PECVD oxide layer is formed.

It will be apparent to those skilled in the art that various modifications and variations can be made in insulating layers and a forming method thereof of the present invention without departing from the spirit or scope of the inventions. Thus, it is intended that the present invention cover the modifications and variations of this invention provided they come within the scope of the appended claims and equivalents.

What is claimed is:

1. A method of forming insulating layers to reduce parasitic capacitance, comprising:
    forming an insulating interlayer on a semiconductor substrate;
    forming a first conductive layer and a first high thermal conductivity, high dielectric constant insulating layer on the insulating interlayer successively;
    forming a first wire by removing portions of the first high thermal conductivity, high dielectric constant insulating layer and the first conductive layer wherein the first high thermal conductivity, high dielectric constant insulating layer remains only on the first wire;
    filling spaces where the first high thermal conductivity, high dielectric constant insulating layer and conductive layer have been removed with a second low dielectric constant insulating layer such that the second low dielectric constant insulating layer extends between and contacts adjacent wire portions to reduce parasitic capacitance between wire portions;
    forming a third high thermal conductivity, high dielectric constant insulating layer on the second low dielectric constant insulating layer and the remaining first high thermal conductivity, high dielectric constant insulating layer;
    forming a via hole exposing a portion of the first wire by removing portions of the first high thermal conductivity, high dielectric constant and third high thermal conductivity, high dielectric constant insulating layers which overlap each other;
    forming a conductive plug filling the via hole; and
    forming a second wire on the third high thermal conductivity, high dielectric constant insulating layer wherein the second wire is connected to the plug electrically.

2. The method of forming insulating layers according to claim 1, wherein the second low dielectric constant insulating layer is formed with an insulating substance having a dielectric constant equal to or less than 4.

3. The method of forming insulating layers according to claim 1, wherein filling spaces where the first high thermal conductivity, high dielectric constant insulating layer and conductive layer have been removed with a second low dielectric constant insulating layer comprises forming the second low dielectric constant insulating layer by a spin-on method; and
    carrying out chemical-mechanical polishing on the second low dielectric constant insulating layer until a surface of the first high conductivity, high dielectric constant insulating layer is exposed.

4. The method of forming insulating layers according to claim 1, wherein the second low dielectric constant insulating layer is formed with an insulating substance having a dielectric constant equal to or less than 4 and having heat conductivity equal to or greater than that of oxide formed by plasma enhanced chemical vapor deposition.

5. The method of forming insulating layers according to claim 1, wherein the first and third insulating layers are formed with insulating substances containing silicon atoms.

6. The method of forming insulating layers according to claim 1, wherein the first and third insulating layers are formed with insulating substances by $O_3$-TEOS reaction or with insulating substances which include carbon and having high heat conductivity.

7. A method of forming insulating layers to reduce parasitic capacitance, comprising:
    forming an insulating interlayer on a semiconductor substrate;
    forming a first conductive layer and a first high thermal conductivity, high dielectric constant insulating layer on the insulating interlayer successively;
    forming a first wire by removing portions of the first high thermal conductivity, high dielectric constant insulating layer and the first conductive layer wherein the first high thermal conductivity, high dielectric constant insulating layer remains only on the first wire;
    filling spaces where the first high thermal conductivity, high dielectric constant insulating layer and conductive layer have been removed with a second low dielectric constant insulating layer such that the second low dielectric constant insulating layer extends between and contacts adjacent wire portions to reduce parasitic capacitance between wire portions; and
    forming a third insulating layer on the second low dielectric insulating layer and the remaining first insulating layer.

8. The method of forming insulating layers according to claim 7, wherein filling spaces where the first high thermal conductivity, high dielectric constant insulating layer and conductive layer have been removed with a second low dielectric constant insulating layer comprises forming the second low dielectric constant insulating layer by a spin-on method; and carrying out chemical-mechanical polishing on the second low dielectric constant insulating layer until a surface of the first high conductivity, high dielectric constant insulating layer is exposed.

9. The method of forming insulating layers according to claim 8, wherein the second insulating layer is formed with an insulating substance having good flow, having a dielectric constant equal to or less than 4 and having heat conductivity equal to or greater than oxide formed by plasma enhanced chemical vapor deposition.

10. The method of forming insulating layers according to claim 7, wherein the second insulating layer is formed with an insulating substance having a dielectric constant equal to or less than 4 and having heat conductivity equal to or greater than that of oxide formed by plasma enhanced chemical vapor deposition.

11. The method of forming insulating layers according to claim 7, wherein the first and third insulating layers are formed with insulating substances containing silicon atoms.

12. The method of forming insulating layers according to claim 7, wherein the first and third insulating layers are formed with insulating substances by $O_3$-TEOS reaction or with insulating substances which include carbon and having high heat conductivity.

13. The method of forming insulating layers according to claim 7, the method further comprising:

forming a via hole exposing a portion of the first wire by removing portions of the first and third insulating layers which overlap each other;

forming a conductive plug filling the via hole; and forming a second wire on the third insulating layer wherein the second wire is connected to the plug electrically.

* * * * *